United States Patent
Wei et al.

(10) Patent No.: US 7,193,453 B2
(45) Date of Patent: Mar. 20, 2007

(54) DUAL LOOP VOLTAGE REGULATION CIRCUIT OF POWER SUPPLY CHIP

(75) Inventors: Da-Chun Wei, Science-Based Industrial Park (TW); Ju-Lin Chia, Science-Based Industrial Park (TW); Yi-Shan Chu, Science-Based Industrial Park (TW)

(73) Assignee: Leadtrend Technology Corp. (TW)

( * ) Notice: Subject to any disclaimer, the term of this patent is extended or adjusted under 35 U.S.C. 154(b) by 35 days.

(21) Appl. No.: 11/208,651

(22) Filed: Aug. 23, 2005

(65) Prior Publication Data

US 2007/0001749 A1    Jan. 4, 2007

(30) Foreign Application Priority Data

Jun. 29, 2005   (TW) .............................. 94121919 A

(51) Int. Cl.
*G05F 1/10*   (2006.01)
(52) U.S. Cl. ...................................... 327/538; 327/112
(58) Field of Classification Search ................ 323/224; 327/110, 112, 535, 538, 540, 543
See application file for complete search history.

(56) References Cited

U.S. PATENT DOCUMENTS

| 6,433,521 | B1 | 8/2002 | Chen et al. | |
| 6,661,208 | B2 * | 12/2003 | Rutter et al. | 323/224 |
| 6,707,280 | B1 * | 3/2004 | Liu et al. | 323/224 |
| 7,057,310 | B2 * | 6/2006 | Liu et al. | 307/126 |

* cited by examiner

*Primary Examiner*—Jeffrey Zweizig
(74) *Attorney, Agent, or Firm*—Harness, Dickey & Pierce, P.L.C.

(57) ABSTRACT

A dual loop voltage regulation circuit of power supply chip is provided, comprising a capacitor for providing a voltage signal, a comparator for comparing a first reference voltage signal and the voltage signal to output forward or backward trigger signal, a first switch triggered by a forward trigger signal, a second switch triggered by a backward trigger signal, a first operational amplifier generating a first drive signal while the first and second switches are on, a first transistor switch triggered to be on by a first drive signal to provide a current source loop, a third switch triggered by a forward trigger signal, a fourth switch triggered by a backward trigger signal, a second operational amplifier generating a second drive signal while the third and fourth switches are on, and a second transistor switch triggered to be on by a second drive signal to provide a current sink loop.

15 Claims, 4 Drawing Sheets

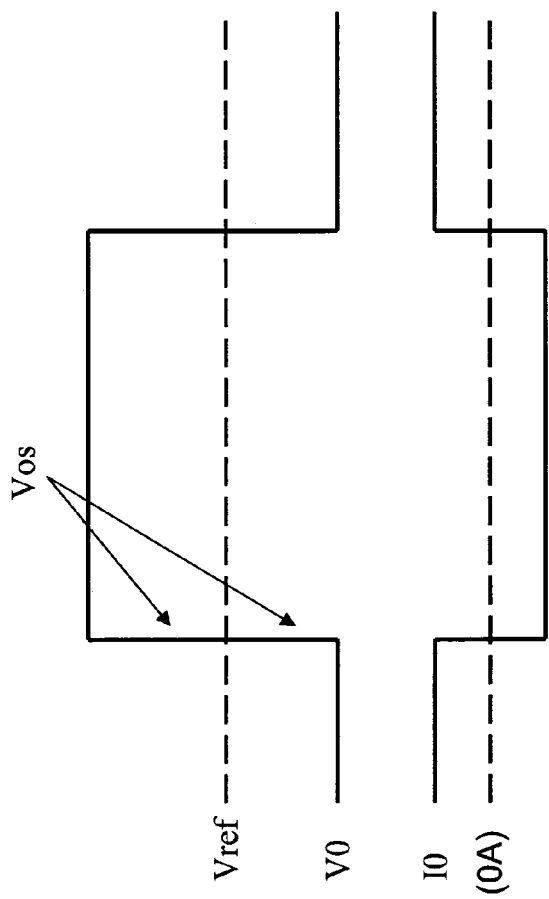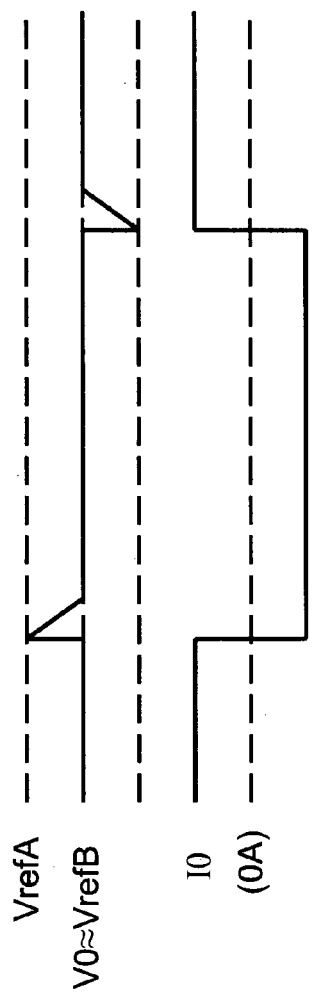
FIG. 4A (prior art)
FIG. 4B

DUAL LOOP VOLTAGE REGULATION CIRCUIT OF POWER SUPPLY CHIP

This Non-provisional application claims priority under 35 U.S.C. § 119(a) on Patent Application No(s). 094121919 filed in Taiwan on Jun. 29, 2005, the entire contents of which are hereby incorporated by reference.

BACKGROUND OF THE INVENTION

1. Field of Invention

The present invention relates to a voltage regulation circuit, and more particularly to a dual loop voltage regulation circuit of power supply chip.

2. Related Art

Generally, a conventional system of a voltage regulation circuit of current source and current sink is a single close loop system. Due to the use of the single close loop system, there is a need for a relatively large offset voltage to control the output of one of the amplifiers to be high potential, resulting in an overtime of the non-overlap, which makes the output voltage dithering easily. Referring to FIG. 1, a circuit diagram of a conventional voltage regulation circuit is illustrated, when an output voltage (V0*R2)/(R1+R2) is lower or higher than a reference voltage signal Vref, the output of one of the operational amplifiers OP is high potential, and a transistor switch (NMOS) is on to provide a current output. However, both of the operational amplifiers OP have drift voltages, so it is necessary to employ a relatively large reference voltage Vref, namely reference voltage Vref with the addition of an offset voltage Vos, for controlling the output. The control system composed of the voltage (i.e. Vref+Vos) and the offset voltages of the operational amplifiers OP requires the non-overlap time, otherwise shortcut will occur in the transistor switch (NMOS). The non-overlap time will be a long period due to the characteristics of the single close loop, which results in a dithering in the output. Also the relatively large reference voltage Vref will cause an output error, referring to FIG. 4A showing an oscillogram of the voltage and current of the prior art.

Furthermore, with reference to the U.S. Pat. No. 6,433,521, a voltage regulator adapted for an active bus terminator is disclosed, which at least comprises a voltage-regulating end for providing a regulated output voltage; a first operational amplifier with one of the in-phase input ends connected to a reference voltage, for receiving a voltage value acquired by taking away a bias voltage from a reference voltage; a second operational amplifier with one of the inverted input ends connected to the reference voltage, for receiving a voltage value acquired by adding a bias voltage to a reference voltage; a first transistor having a control gate connected to an output end of the first operational amplifier, a source connected to the voltage-regulating end and an inverted input end of the first operational amplifier through a feedback network, which in combination with the first operational amplifier constitutes a voltage regulation circuit having the ability to outflow current; a second transistor, having the control gate connected to an output end of the second operational amplifier, a drain connected to the voltage-regulating end and then to an in-phase input end of the second operational amplifier through the same feedback network, which in combination with the second operational amplifier constitutes a voltage regulation circuit having the ability to sink current, thus avoiding the occurrence of the breakdown current, however, the non-overlap time cannot be reduced, which results in dithering in the output voltage.

Therefore, the problem about how to provide a voltage regulation circuit with relatively stable output is one of the problems to be solved to researchers.

SUMMARY OF THE INVENTION

In view of the above-mentioned problems, the main object of the present invention is to provide a dual loop voltage regulation circuit of power supply chip. Through the controlling of the switches, the transition of the amplifier is accelerated and the non-overlap time is reduced, and therefore the output voltage is rapid and stable, thus improving the dithering in a conventional stabilizing circuit output voltage and reducing the errors caused by the output.

Therefore, in order to achieve the above-mentioned object, the dual loop voltage regulation circuit of power supply chip disclosed in the present invention comprises a capacitor, a comparator, a first switch, a second switch, a third switch, a fourth switch, a first operational amplifier, a second operational amplifier, a first transistor switch and a second transistor switch.

The capacitor is arranged at the output end of the dual loop voltage regulation circuit to provide a voltage signal.

The comparator is used for comparing a first reference voltage and a voltage signal so as to output a forward trigger signal or a backward trigger signal.

The first switch connected to the output of the comparator is triggered by the forward trigger signal and may be constituted of a bipolar junction transistor (BJT) switch or a metal-oxide semiconductor transistor (MOS) switch.

The second switch connected to the output of the comparator is triggered by the backward trigger signal and may be constituted of a bipolar junction transistor (BJT) switch or a metal-oxide semiconductor transistor (MOS) switch.

The first operational amplifier generates a first drive signal by operating the second reference voltage signal received by the forward input end and the signal from the backward input end of the first operational amplifier, when the first switch or the second switch is on.

The first transistor switch, which may be constituted of the NMOS (N-type metal-oxide semiconductor) transistor switch or the PMOS (P-type metal-oxide semiconductor) transistor switch, is triggered to be on by the first drive signal to provide a current source loop.

The third switch, which may be constituted of a bipolar junction transistor (BJT) switch or a metal-oxide semiconductor (MOS) transistor switch, is triggered by the forward trigger signal.

The fourth switch, which may be constituted of a bipolar junction transistor (BJT) switch or a metal-oxide semiconductor (MOS) switch, is triggered by the backward trigger signal.

The second operational amplifier generates a second drive signal by operating the second reference voltage signal received by the backward input end and the signal from the forward input end of the second operational amplifier, when the third switch or the fourth switch is on.

The second transistor switch, which may be constituted of the NMOS (N-type metal-oxide semiconductor) transistor switch or the PMOS (P-type metal-oxide semiconductor) transistor switch, is triggered to be on by the second drive signal to provide a current sink loop.

With this dual loop voltage regulation circuit of power supply chip and through each loop switch triggered to be on or off by the comparator, the current source loop or the sink loop is provided and the non-overlap time in the voltage regulation circuit and the dithering in the output voltage are reduced, therefore improving the voltage output quality of the voltage regulation circuit.

Features and practice of the present invention will be described below in more detail with reference to the drawings in conjunction with the preferred embodiments.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein:

FIG. 4A is an oscillogram of the voltage and current of the prior art; and

FIG. 4B is an oscillogram of the voltage and current of the present invention.

DETAILED DESCRIPTION OF THE INVENTION

Figure 2:
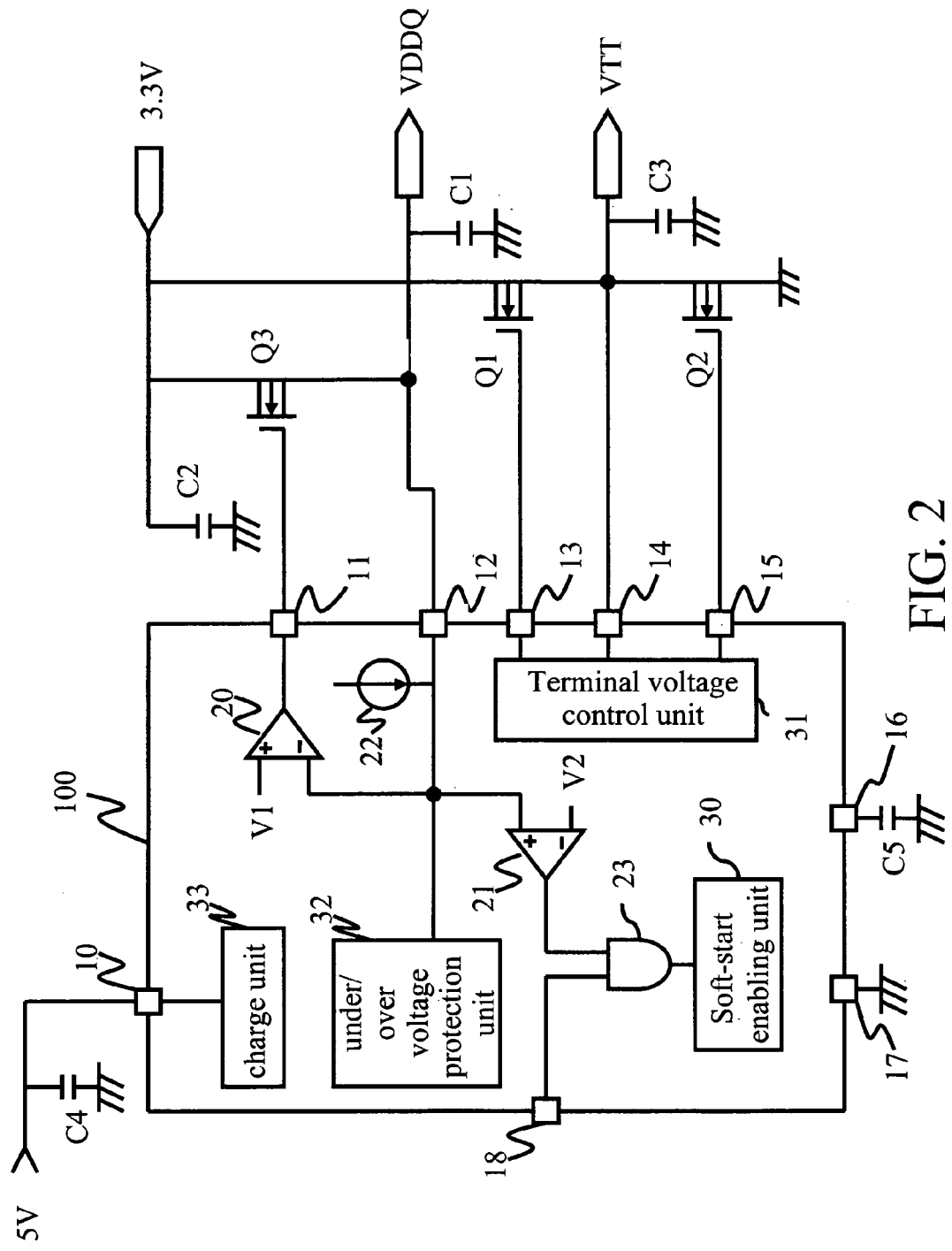
FIG. 2 is a circuit block diagram of the power supply chip of the present invention.

With reference to FIG. 2, a system block diagram of the power supply chip of the present invention is disclosed, which comprises a first voltage comparator unit 20, a third transistor switch Q3, a second voltage comparator unit 21, a current source unit 22, an arithmetic logic unit 23, a soft start enabling unit 30 and a terminal voltage control unit 31.

The first voltage comparator unit 20 which may be constituted of a comparator used for comparing the reference voltage signal V1 and the voltage level formed by the first capacitor C1 so as to output a first drive signal, in which the first input end receives a reference voltage signal V1, and the second input end is connected to the under/over voltage protection unit 32.

The third transistor switch Q3, which may be constituted of the NMOS (N-type metal-oxide semiconductor) transistor switch or the PMOS (P-type metal-oxide semiconductor) transistor switch, is triggered to be on by the first drive signal and will be illustrated as a NMOS (N-type metal-oxide semiconductor) transistor switch in FIG. 2, in which the gate is connected to the endpoint 11; the endpoint 11 is connected to the output end of the first voltage comparator unit 20; the drain is connected to one end of the second capacitor C2 while the other of the second capacitor C2 is connected to the ground; and the source is connected to the endpoint 12 while the endpoint 12 is connected to the first input end of the second voltage comparator unit 21.

The current source unit 22 with one end connected to the endpoint 12 is used for providing a micro-current (about 15 mA) to charge the first capacitor C1 as the detection of the endpoint impedance.

The second voltage comparator unit 21 may be constituted of a comparator, in which the first input end is connected to the endpoint 12; and the second input end receives a threshold voltage signal V2 to compare the supply voltage signal VDDQ and the threshold voltage signal V2 (about 0.15V) so as to output a second drive signal.

Arithmetic logic unit 23, which may be constituted of the AND gate switch, in which the first input end is connected to the endpoint 18 which receives an enabling signal while the second input end is connected to the output end of the second voltage comparator unit 21, and a logic operation is carried out between the second drive signal and the enabling signal so as to output a third drive signal.

The soft start enabling unit 30 connected to the output end of the arithmetic logic unit 23 is used for receiving the third drive signal so as to enable the starting process of the source chip 100.

The terminal voltage control unit 31, which may be constituted of a voltage regulation circuit, is used for providing a terminal voltage VTT to a memory module (not shown).

Furthermore, the connection relationship of partial endpoints of the power supply chip 100 will be described as follows. One end of the fourth capacitor C4 is connected to a power supply of 5V and the other end is connected to the endpoint 10, and the endpoint 10 is connected to the charge unit 33. The drain of the second transistor switch Q2 is connected to a 3.3V power supply; the gate is connected to the endpoint 13; and the source is connected to the endpoint 14, in which the first transistor switch Q1 may be constituted of the NMOS (N-type metal-oxide semiconductor) transistor switch or the PMOS (P-type metal-oxide semiconductor) transistor switch and will be illustrated as a NMOS transistor switch in FIG. 2. The drain of the second transistor switch Q2 is connected to the endpoint 14; the gate is connected to the endpoint 15; and the source is connected to the ground, in which the second transistor switch Q2 may be constituted of the NMOS (N-type metal-oxide semiconductor) transistor switch or the PMOS (P-type metal-oxide semiconductor) transistor switch and will be illustrated as a NMOS transistor switch in FIG. 2. One end of the third capacitor C3 is connected to the endpoint 14 while the other end is connected to the ground. One end of the fifth capacitor C5 is connected to the endpoint 16 while the other end is connected to the ground. The endpoint 17 is connected to the ground.

Figure 3:
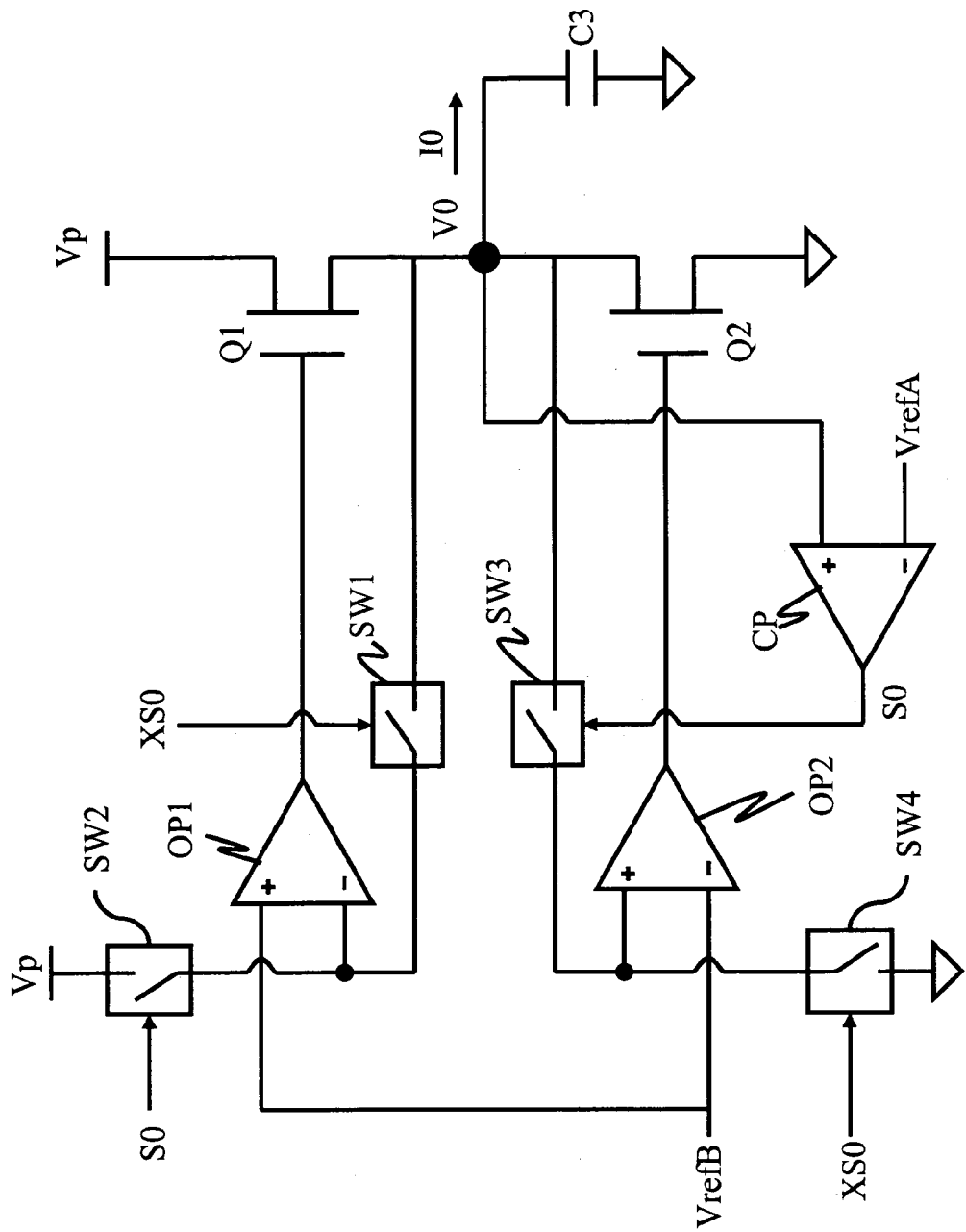
FIG. 3 is a circuit diagram of the terminal voltage control unit of the present invention.

With reference to FIG. 3, a circuit diagram of the terminal voltage control unit of the present invention is disclosed, which comprises a third capacitor C3, a first operational amplifier OP1, a second operational amplifier OP2, a first switch SW1, a second switch SW2, a third switch SW3, a fourth switch SW4, a first transistor switch Q1 and a second transistor switch Q2.

The third capacitor C3 is arranged at the output end of the voltage regulation circuit with one end connected to the source of the first transistor switch Q1 and the other to the ground so as to provide a voltage signal V0.

The comparator CP has two input ends and one output end, in which the forward input end is connected to the provided voltage signal V0, i.e. the source of the first transistor switch Q1; the backward input end receives a first reference voltage signal VrefA to compare the voltage signal V0 and the first reference voltage signal VrefA and output the forward trigger signal S0 or the backward trigger signal XS0 according to the result of comparison. The first reference voltage VrefA may be equal to the sum of the second reference voltage VrefB and the limitation Vos required by the voltage signal V0.

The first operational amplifier OP1 has two input ends and one output end, in which the forward input end is connected to the second reference voltage VrefB while the backward input end is connected to the first switch SW1 and the second switch SW2 respectively; and the output end is connected to the gate of the first transistor switch Q1.

The second operational amplifier OP2 has two input ends and an output end, in which the forward input end is connected to the third switch SW3 and the fourth switch SW4 respectively while the backward input end is connected to the second reference voltage VrefB; and the output end is connected to the gate of the first transistor switch Q1.

The first switch SW1, which may be constituted of a bipolar junction transistor (BJT) switch or a metal-oxide semiconductor (MOS) transistor switch, has three connecting ends, in which the first end is connected to the backward input end of the first operational amplifier OP1; the second end is connected to the source of the first transistor switch Q1; and the third end is connected to the output end of the comparator CP so as to receive the backward trigger signal XS0 output from the comparator CP.

The second switch SW2, which may be constituted of a bipolar junction transistor (BJT) switch or a metal-oxide semiconductor (MOS) transistor switch, has three connecting ends, in which the first end is connected to the backward input end of the first operational amplifier OP1; the second end is connected to the power end Vp; and the third end is connected to the output end of the comparator CP so as to receive the forward trigger signal S0 output from the comparator CP.

The third switch SW3, which may be constituted of a bipolar junction transistor (BJT) switch or a metal-oxide semiconductor (MOS) transistor switch, has three connecting ends, in which the first end is connected to the forward input end of the second operational amplifier OP2; the second end is connected to the drain of the second operational amplifier OP2; and the third end is connected to the output end of the comparator CP so as to receive the forward trigger signal S0 output from the comparator CP.

The fourth switch SW4, which may be constituted of a bipolar junction transistor (BJT) switch or a metal-oxide semiconductor (MOS) transistor switch, has three connecting ends, in which the first end is connected to the forward input end of the second operational amplifier OP2; the second end is connected to the ground; and the third end is connected to the output end of the comparator CP so as to receive the backward trigger signal XS0 output from the comparator CP.

The first transistor switch Q1 may be constituted of the NMOS (N-type metal-oxide semiconductor) transistor switch or the PMOS (P-type metal-oxide semiconductor) transistor switch and will be illustrated as a NMOS (N-type metal-oxide semiconductor) transistor switch in FIG. 3, in which the gate is connected to the output end of the first operational amplifier OP1; the drain is connected to the power end Vp; and the source is connected to the drain of the second transistor switch Q2.

The second transistor switch Q2 may be constituted of the NMOS (N-type metal-oxide semiconductor) transistor switch or the PMOS (P-type metal-oxide semiconductor) transistor switch and will be illustrated as a NMOS (N-type metal-oxide semiconductor) transistor switch in FIG. 3, in which the gate is connected to the output end of the second operational amplifier OP2; the drain is connected to the source of the first transistor switch Q2; and the source is connected to the ground.

The circuit action principle will be explained below. When the voltage signal V0 falls in the range of the first reference voltage signal VrefA+/−Vos, the comparator CP outputs the forward trigger signal S0 to the second switch SW2 and the third switch SW3 so as to enable one loop to be on and the other to be off. Meanwhile, the first operational amplifier OP1 outputs the first drive signal after the operation of the forward and backward input signals thereof so as to turn on the first transistor switch Q1, thereby providing the current source loop. When the voltage signal V0 does not fall in the range of the first reference voltage signal VrefA, the comparator CP outputs the backward trigger signal XS0 to the first switch SW1 and the fourth switch SW4 so as to enable one loop to be on and the other to be off. Meanwhile, the second operational amplifier OP2 outputs the second drive signal after the operation of the forward and backward input signals thereof, so as to turn on the second transistor switch Q2, thereby providing the current sink loop.

Figure 1:
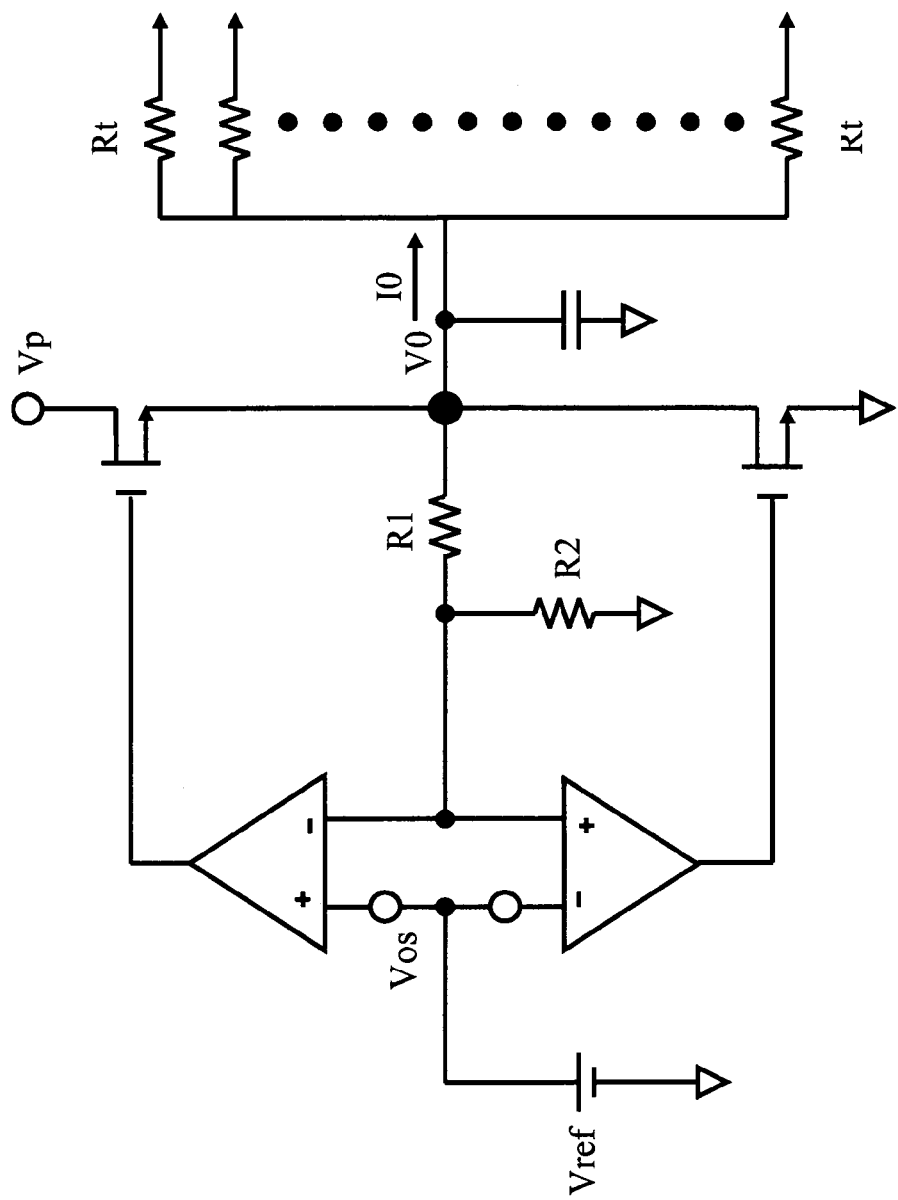
FIG. 1 is a circuit diagram of the voltage regulation circuit of the prior art.

In this way, the resistance R1 and resistance R2 of FIG. 1 are not needed, and thus the manufacture cost can be reduced, and the output stability of the voltage regulation circuit is improved.

With the dual loop voltage regulation circuit of power supply chip and through each loop switch triggered to be on or off by the comparator, the loop of the current source or sink is provided and the errors in the output voltage, the non-overlap time in the voltage regulation circuit and the dithering in the output voltage are reduced, therefore improving the voltage output quality of the voltage regulation circuit. Referring to FIG. 4B, an oscillogram of voltage and current of the present invention is disclosed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A dual loop voltage regulation circuit of power supply chip, comprising:
    a capacitor arranged at the output end of the voltage regulation circuit to provide a voltage signal;
    a comparator comparing a first reference voltage signal and the voltage signal so as to output a forward trigger signal or a backward trigger signal;
    a first switch connected to the output end of the comparator, triggered by the forward trigger signal;
    a second switch connected to the output end of the comparator, triggered by the backward trigger signal;
    a first operational amplifier, wherein when the first switch or the second switch is on, the forward input end receives a second reference voltage signal and generates a first drive signal after the operation on the signal from the backward input end of the first operational amplifier;
    a first transistor switch triggered to be on by the first drive signal so as to provide a current source loop;
    a third switch connected to the output end of the comparator, triggered by the forward trigger signal;
    a fourth switch connected to the output end of the comparator, triggered by the backward trigger signal;
    a second operational amplifier, wherein when the third switch or the fourth switch is on, the backward input end receives the second reference voltage signal and generates a second drive signal after the operation on the signal from the forward input end of the second operational amplifier; and a second transistor switch triggered to be on by the second drive signal so as to provide a current sink loop.

2. The dual loop voltage regulation circuit according to claim 1, wherein the first transistor switch is an N-type metal-oxide semiconductor transistor switch.

3. The dual loop voltage regulation circuit according to claim 1, wherein the first transistor switch is a P-type metal-oxide semiconductor transistor switch.

4. The dual loop voltage regulation circuit according to claim 1, wherein the second transistor switch is an N-type metal-oxide semiconductor transistor switch.

5. The dual loop voltage regulation circuit according to claim 1, wherein the second transistor switch is a P-type metal-oxide semiconductor transistor switch.

6. The dual loop voltage regulation circuit according to claim 1, wherein the first switch is a bipolar junction transistor switch.

7. The dual loop voltage regulation circuit according to claim 1, wherein the first switch is a metal-oxide semiconductor transistor switch.

8. The dual loop voltage regulation circuit according to claim 1, wherein the second switch is a bipolar junction transistor switch.

9. The dual loop voltage regulation circuit according to claim 1, wherein the second switch is a metal-oxide semiconductor transistor switch.

10. The dual loop voltage regulation circuit according to claim 1, wherein the third switch is a bipolar junction transistor switch.

11. The dual loop voltage regulation circuit according to claim 1, wherein the third switch is a metal-oxide semiconductor transistor switch.

12. The dual loop voltage regulation circuit according to claim 1, wherein the fourth switch is a bipolar junction transistor switch.

13. The dual loop voltage regulation circuit according to claim 1, wherein the fourth switch is a metal-oxide semiconductor transistor switch.

14. The dual loop voltage regulation circuit according to claim 1, wherein the output end of the first operational amplifier is connected to the gate of the first transistor switch.

15. The dual loop voltage regulation circuit according to claim 1, wherein the output end of the second operational amplifier is connected to the gate of the second transistor switch.

* * * * *